United States Patent
Cheng et al.

(10) Patent No.: US 9,171,939 B2
(45) Date of Patent: Oct. 27, 2015

(54) METHOD FOR MANUFACTURING THIN-FILM TRANSISTOR AND THIN-FILM TRANSISTOR MANUFACTURED WITH SAME

(71) Applicant: Shenzhen China Star Optoelectronics Technology Co., LTD., Shenzhen, Guangdong Province (CN)

(72) Inventors: Yangling Cheng, Shenzhen (CN); Hsiangchih Hsiao, Shenzhen (CN)

(73) Assignee: SHENZHEN CHINA STAR OPTOELECTRONICS TECHNOLOGY CO., LTD., Shenzhen, Guangdong Province (CN)

(*) Notice: Subject to any disclaimer, the term of this patent is extended or adjusted under 35 U.S.C. 154(b) by 383 days.

(21) Appl. No.: 13/806,131

(22) PCT Filed: Oct. 12, 2012

(86) PCT No.: PCT/CN2012/082819
§ 371 (c)(1),
(2) Date: Dec. 20, 2012

(87) PCT Pub. No.: WO2014/047981
PCT Pub. Date: Apr. 3, 2014

(65) Prior Publication Data
US 2015/0137112 A1 May 21, 2015

(30) Foreign Application Priority Data
Sep. 28, 2012 (CN) .......................... 2012 1 0370615

(51) Int. Cl.
H01L 29/66 (2006.01)
H01L 29/786 (2006.01)

(52) U.S. Cl.
CPC ...... *H01L 29/66969* (2013.01); *H01L 29/7869* (2013.01)

(58) Field of Classification Search
USPC .......... 257/43, 223, 227, 291, 292, 439, 443, 257/655, E27.1, E27.125, E27.11, 2, 257/E29.117, E29.145, E29.147, E29.151, 257/E29.182, E29.202, E29.273–E29.299, 257/E29.314, E29.32, E23.016
See application file for complete search history.

(56) References Cited

U.S. PATENT DOCUMENTS

2013/0032794 A1* 2/2013 Lee et al. ........................ 257/43

FOREIGN PATENT DOCUMENTS

| CN | 101728278 A | 6/2010 |
| CN | 102157387 A | 8/2011 |
| CN | 102201367 A | 9/2011 |

Primary Examiner — Mamadou Diallo
(74) Attorney, Agent, or Firm — Cheng-Ju Chiang

(57) ABSTRACT

The present invention provides a method for manufacturing a thin-film transistor and a thin-film transistor manufactured with same. The method includes (1) providing a substrate; (2) forming a first metal layer on the substrate and applying a masking operation to form a gate terminal; (3) forming a gate insulation layer on the gate terminal; (4) forming an oxide semiconductor layer on the gate insulation layer and forming a second metal layer on the oxide semiconductor layer, wherein the second metal layer includes a titanium layer formed on the oxide semiconductor layer and a copper layer formed on the titanium layer and is subjected to a masking operation to form a data line and source/drain terminal; and (5) forming a transparent conductive layer on the second metal layer and applying a masking operation to patternize the transparent conductive layer to form the thin-film transistor.

9 Claims, 10 Drawing Sheets

METHOD FOR MANUFACTURING THIN-FILM TRANSISTOR AND THIN-FILM TRANSISTOR MANUFACTURED WITH SAME

BACKGROUND OF THE INVENTION

1. Field of the Invention

The present invention relates to the field of flat panel display technology, and in particular to a method for manufacturing a thin-film transistor and a thin-film transistor manufactured with the method.

2. The Related Arts

Liquid crystal displays (LCDs) have numerous advantages, such as thin device body, less power consumption, and being free of radiation, and is thus widely used. Most of the liquid crystal displays available in the market are backlighting liquid crystal displays, which comprise a liquid crystal display panel and a backlight module. The operation principle of the liquid crystal display panel is that liquid crystal molecules are arranged between two parallel glass substrates and electricity is selectively applied to the glass substrates to control change of the orientation of the liquid crystal molecules in order to refract out the light from a backlight module for formation of an image.

A liquid crystal display panel is generally composed of a color filter (CF) substrate, a thin-film transistor (TFT) substrate, liquid crystal (LC) interposed between the CF substrate and the TFT substrate, and a sealant. A general manufacturing process comprises a front stage of array process (including thin film, yellow light, etching, and film stripping), an intermediate stage of cell process (including bonding TFT substrate and the CF substrate), and a rear stage of assembling process (including mounting drive ICs and printed circuit board). The front stage of array process generally makes the TFT substrate for controlling the movement of liquid crystal molecules. The intermediate stage of cell process generally introduces liquid crystal between the TFT substrate and the CF substrate. The rear stage of assembling process generally mounts the drive ICs and combining the printed circuit board to effect driving the liquid crystal molecules to rotate for displaying images.

The TFT substrate generally comprises a glass substrate and TFTs formed on the glass substrate. The thin-film transistors are generally of three structures, which are a coplanar structure, an island-stop structure, and a BCE (back channel etch) structure. The currently available oxide thin-film transistors primarily belong to the coplanar structure and the island-stop structure. This is because the BCE structure may cause damage to the oxide semiconductor layers in the manufacturing process and thus affect the electrical property thereof.

Referring to FIG. 1, a schematic view is given to illustrate the structure of a BCE structure thin-film transistor that is formed on a glass substrate 100 through a five-masking-operation manufacturing process and comprises a gate terminal 101 formed on the glass substrate 100, a gate insulation layer 103, a oxide semiconductor layer 105 formed on the gate insulation layer 103, and a source/drain terminal 107 formed on the oxide semiconductor layer 105. The oxide semiconductor layer 105 comprises at least one of zinc oxide ($ZnO_x$), tin oxide ($SnO_x$), indium oxide ($InO_x$), and gallium oxide ($GaO_x$) and indium gallium zinc oxide (IGXO) is commonly used. The source/drain terminal 107 is generally composed of an aluminum (Al) layer and a molybdenum (Mo) layer sequentially formed on the oxide semiconductor layer 105 through sputtering, followed by coating of photoresist material, exposure, development, etching, and removal of the photoresist material. An etching operation is applied in processing the aluminum layer and the etchant solution used is generally a mixed acid of phosphoric acid ($H_3PO_4$) and nitric acid ($HNO_3$). However, the mixed acid of phosphoric acid and nitric acid may also react with the oxide semiconductor layer 105, making the oxide semiconductor layer 105 etched away and thus affecting the electrical property of the thin-film transistor and deteriorating the quality of the thin-film transistor.

SUMMARY OF THE INVENTION

An object of the present invention is to provide a method for manufacturing a thin-film transistor, which simplifies the manufacturing process, lowers down the manufacturing cost, and improves the electrical property of a thin-film transistor so manufactured.

Another object of the present invention is to provide a thin-film transistor, which has a simple manufacturing process and shows improved electrical property.

To achieve the objects, the present invention provides a method for manufacturing a thin-film transistor, which comprises the following steps:

(1) providing a substrate;

(2) forming a first metal layer on the substrate and applying a masking operation to form a gate terminal;

(3) forming a gate insulation layer on the gate terminal;

(4) forming an oxide semiconductor layer on the gate insulation layer and forming a second metal layer on the oxide semiconductor layer, wherein the second metal layer comprises a titanium layer formed on the oxide semiconductor layer and a copper layer formed on the titanium layer and is subjected to a masking operation to form a data line and source/drain terminal; and (5) forming a transparent conductive layer on the second metal layer and applying a masking operation to patternize the transparent conductive layer to form the thin-film transistor.

The substrate comprises a glass or plastic substrate.

The titanium layer has a thickness less than 12 nm.

The oxide semiconductor layer comprises at least one of zinc oxide, tin oxide, indium oxide, and gallium oxide.

The masking operation of step (4) comprises:

(4.11) forming a photoresist layer on the copper layer and applying exposure and wet etching to form the data line and forming a channel in the photoresist layer at a corresponding location;

(4.12) applying dry etching to the titanium layer with carbon tetrafluoride or sulfide hexafluoride;

(4.13) ashing a bottom of the channel with oxygen to expose the copper layer;

(4.14) applying wet etching to the oxide semiconductor layer with oxalic acid;

(4.15) applying wet etching to the exposed copper layer with keto acid in order to expose the titanium layer; and (4.16) applying dry etching to the exposed titanium layer with carbon tetrafluoride or sulfide hexafluoride and removing the photoresist layer to form a source/drain terminal.

The masking operation of step (4) comprises:

(4.21) forming a photoresist layer on the copper layer and applying exposure and wet etching to form the data line and forming a channel in the photoresist layer at a corresponding location;

(4.22) applying dry etching to the titanium layer with carbon tetrafluoride or sulfide hexafluoride;

(4.23) ashing a bottom of the channel with oxygen to expose the copper layer;
(4.24) applying wet etching to the oxide semiconductor layer with oxalic acid;
(4.25) applying wet etching to the exposed copper layer with keto acid in order to expose the titanium layer;
(4.26) oxidizing a surface of the copper layer with oxygen to form a cupric oxide layer on a side wall; and
(4.27) applying dry etching to the exposed titanium layer with chlorine and removing the photoresist layer to form a source/drain terminal.

The present invention also provides a method for manufacturing a thin-film transistor, which comprises the following steps:
(1) providing a substrate;
(2) forming a first metal layer on the substrate and applying a masking operation to form a gate terminal;
(3) forming a gate insulation layer on the gate terminal;
(4) forming an oxide semiconductor layer on the gate insulation layer and forming a second metal layer on the oxide semiconductor layer, wherein the second metal layer comprises a titanium layer formed on the oxide semiconductor layer and a copper layer formed on the titanium layer and is subjected to a masking operation to form a data line and source/drain terminal; and
(5) forming a transparent conductive layer on the second metal layer and applying a masking operation to patternize the transparent conductive layer to form the thin-film transistor; and
wherein the substrate comprises a glass or plastic substrate;
wherein the titanium layer has a thickness less than 12 nm;
wherein the oxide semiconductor layer comprises at least one of zinc oxide, tin oxide, indium oxide, and gallium oxide; and
wherein the masking operation of step (4) comprises:
(4.11) forming a photoresist layer on the copper layer and applying exposure and wet etching to form the data line and forming a channel in the photoresist layer at a corresponding location;
(4.12) applying dry etching to the titanium layer with carbon tetrafluoride or sulfide hexafluoride;
(4.13) ashing a bottom of the channel with oxygen to expose the copper layer;
(4.14) applying wet etching to the oxide semiconductor layer with oxalic acid;
(4.15) applying wet etching to the exposed copper layer with keto acid in order to expose the titanium layer; and
(4.16) applying dry etching to the exposed titanium layer with carbon tetrafluoride or sulfide hexafluoride and removing the photoresist layer to form a source/drain terminal.

The present invention further provides a thin-film transistor, which comprises a substrate, a gate terminal formed on the substrate, a gate insulation layer covering the gate terminal, an oxide semiconductor layer formed on the gate insulation layer, and a source/drain terminal formed on the oxide semiconductor layer. The source/drain terminal comprises a titanium layer and a copper layer formed on the titanium layer.

The substrate comprises a glass or plastic substrate.
The titanium layer has a thickness less than 12 nm.
The oxide semiconductor layer comprises at least one of zinc oxide, tin oxide, indium oxide, and gallium oxide.
The efficacy of the present invention is that the present invention provides a method for manufacturing a thin-film transistor and a thin-film transistor manufactured with same, which simultaneously form an oxide semiconductor layer and a second metal layer, wherein the second metal layer is a combined layer of a titanium layer and a copper layer and etching with keto acid is applied to the copper layer and etching with carbon tetrafluoride, sulfide hexafluoride or chlorine gas is applied to the titanium layer to thereby form a source/drain terminal. Compared to a conventional thin-film transistor of which a source/drain terminal is formed of an aluminum layer and a molybdenum layer, masking operations are reduced so as to effectively shorten manufacturing time and lower down manufacturing cost. Further, the thin-film transistor according to the present invention shows better electrical property than that of a conventional coplanar-structure thin-film transistor and thus improves the quality of thin-film transistor.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

Figure 1:
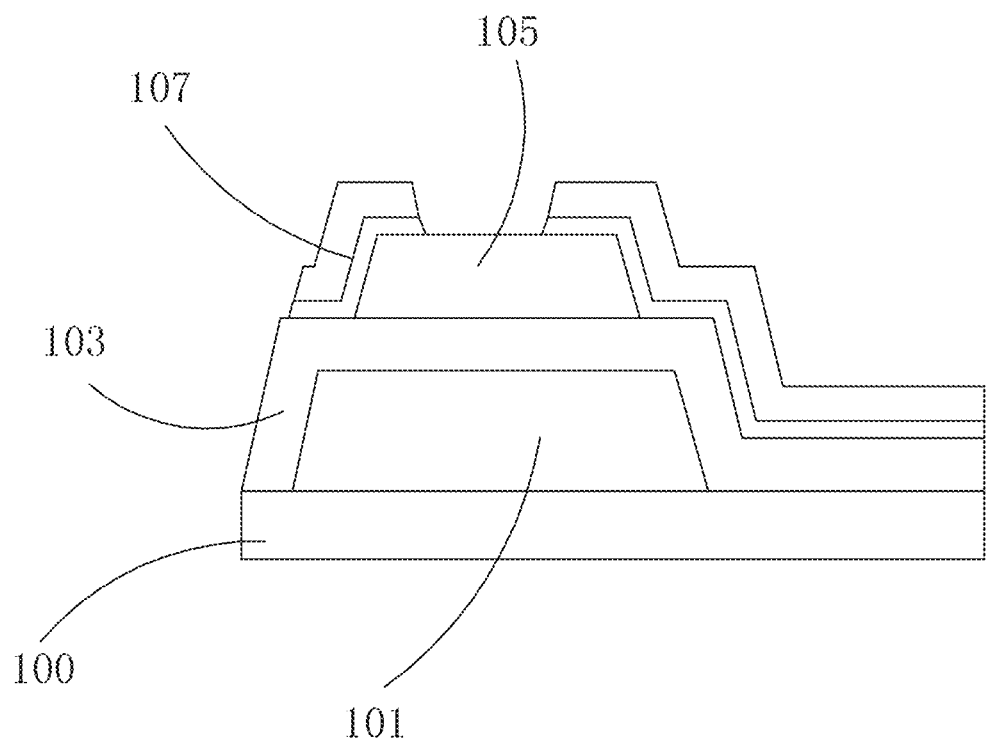
FIG. 1 is a schematic view showing the structure of a conventional BCE (Back Channel Etch) structure thin-film transistor formed on a glass substrate through a five-masking-operation manufacturing process.
Figure 2:
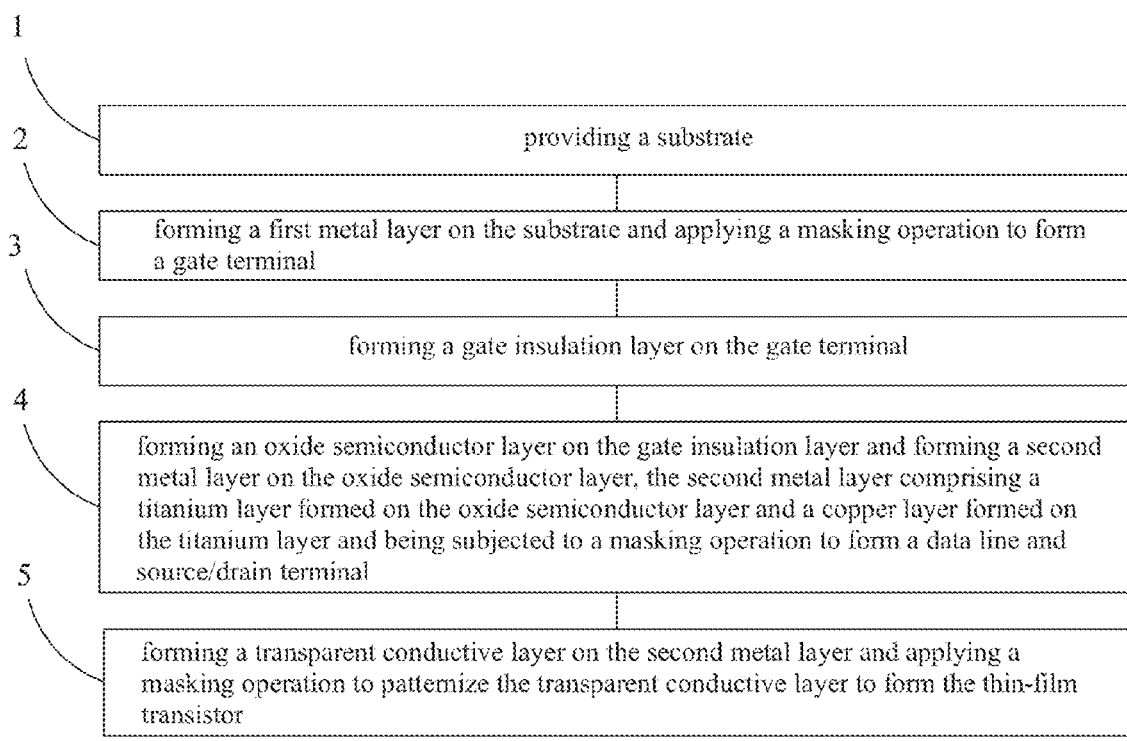
FIG. 2 is a flow chart illustrating a method for manufacturing a thin-film transistor according to the present invention.
Figure 3:
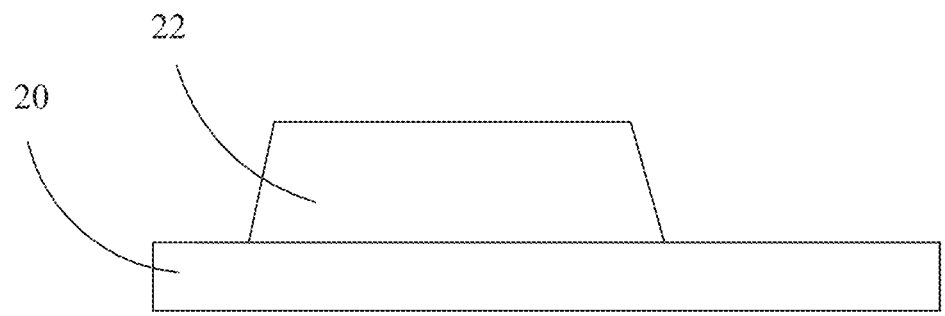
FIGS. 3-9 illustrate the flow of a method for manufacturing a thin-film transistor according to an embodiment of the present invention.
Figure 4:
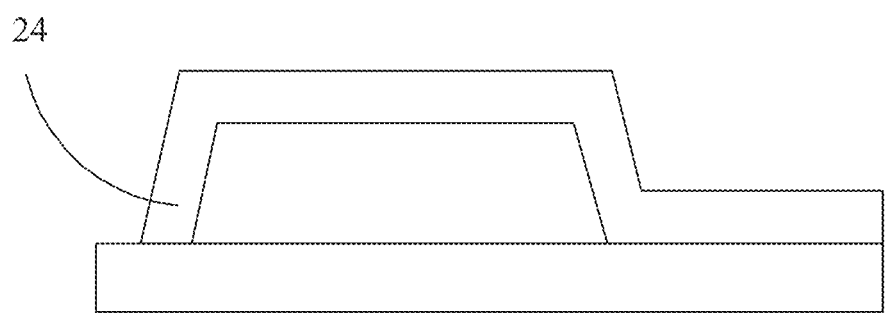
Figure 5:
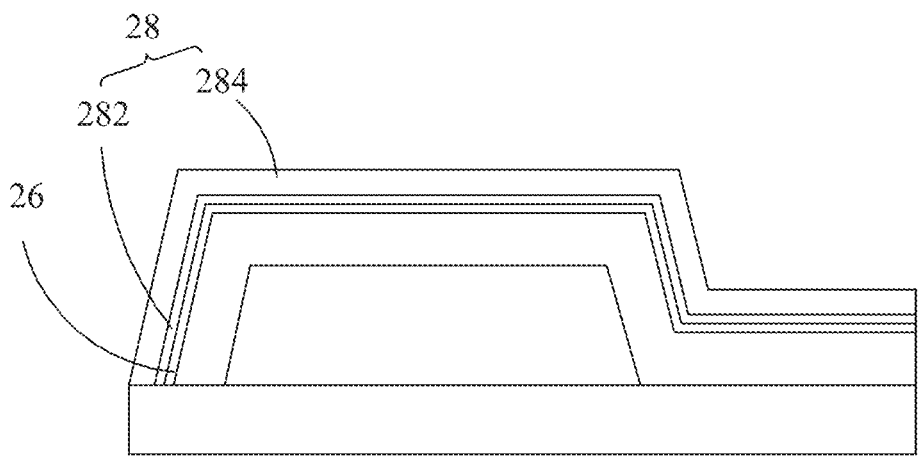
Figure 6:
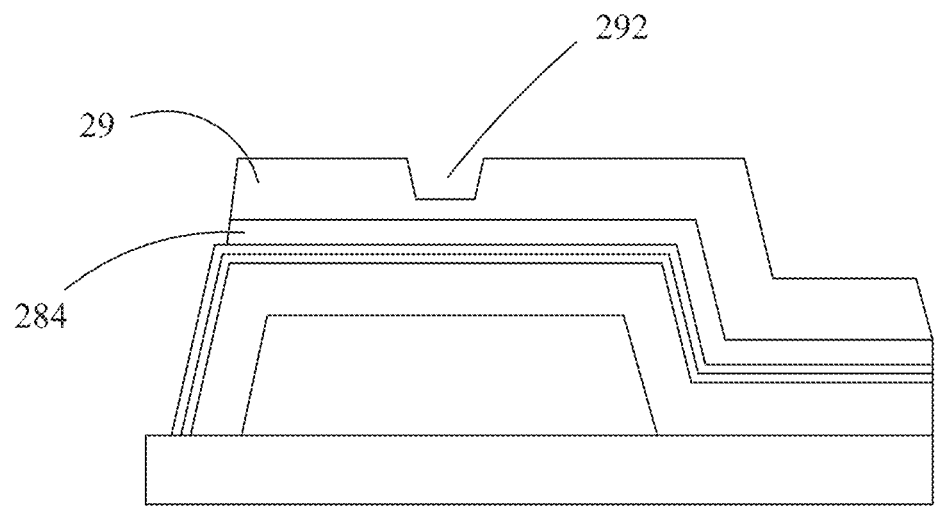
Figure 7:
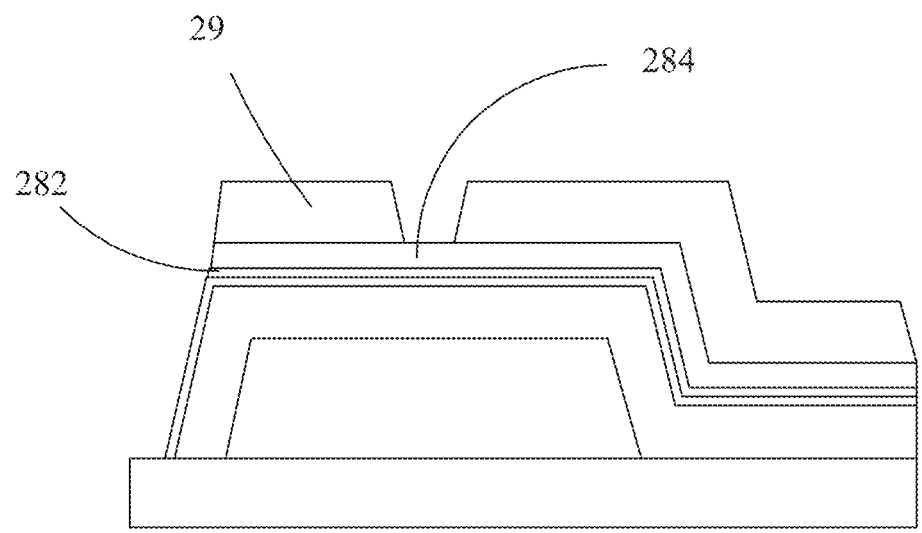
Figure 8:
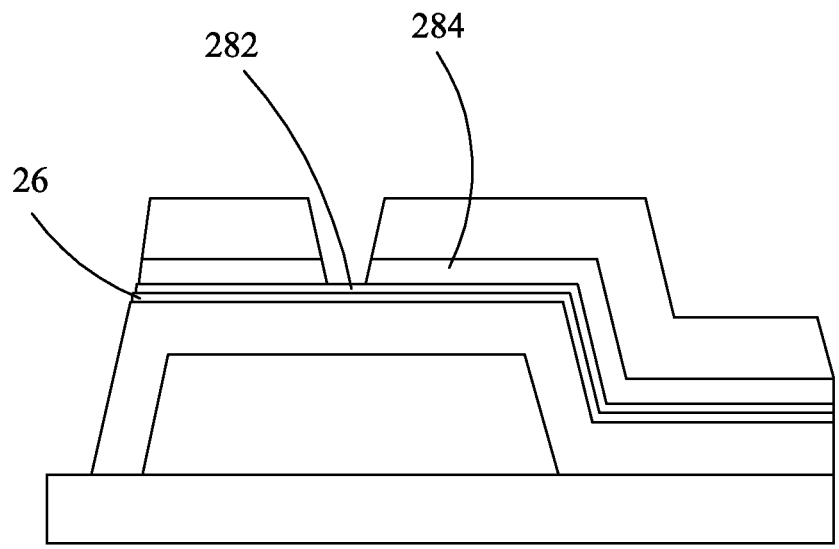
Figure 9:
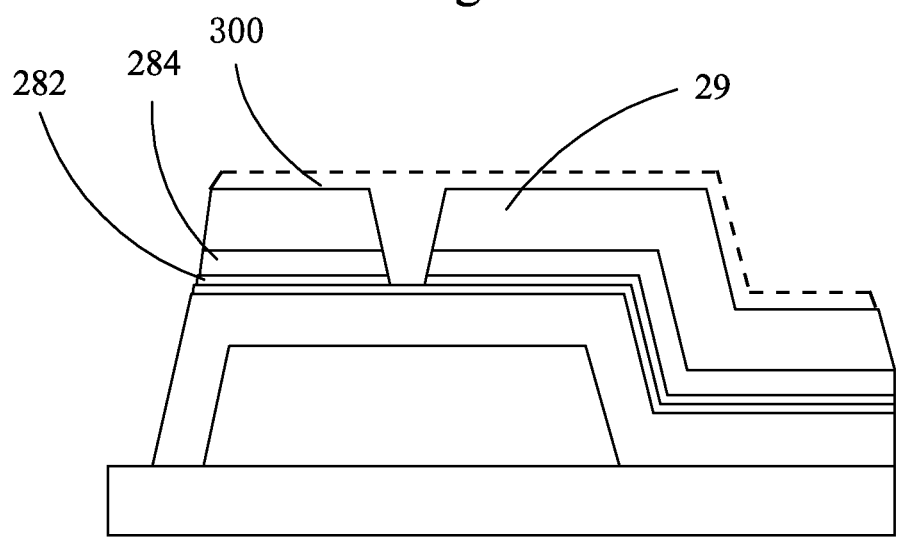
Figure 10:
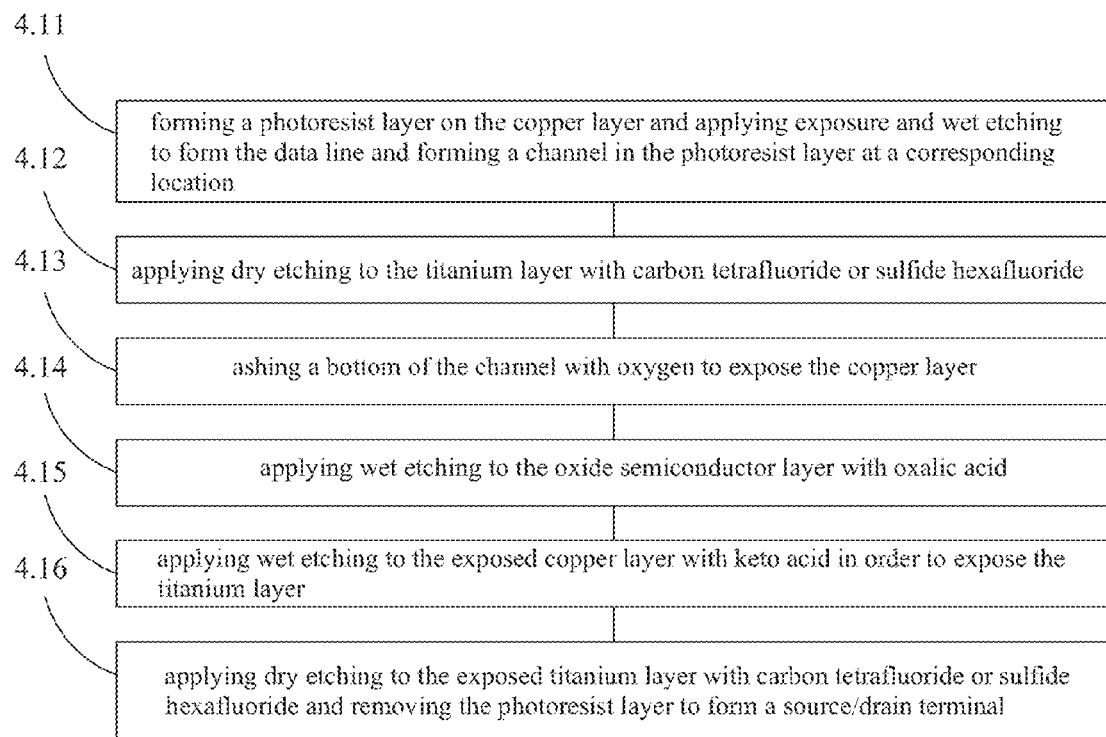
FIG. 10 is a flow chart illustrating step 4 of a method for manufacturing a thin-film transistor according to an embodiment of the present invention.

To further expound the technical solution adopted in the present invention and the advantages thereof, a detailed description is given to a preferred embodiment of the present invention and the attached drawings.

Referring to FIGS. 2-11, the present invention provides a method for manufacturing a thin-film transistor, which comprises the following steps:

Step 1: providing a substrate 20.

The substrate 20 is a transparent substrate and is preferably a glass or plastic substrate.

Step 2: forming a first metal layer 22 on the substrate 20 and applying a masking operation to form a gate terminal.

The first metal layer 22 comprises copper (Cu), aluminum (Al), molybdenum (Mo), titanium (Ti), or a laminated structure thereof.

Step 3: forming a gate insulation layer 24 on the gate terminal.

The gate insulation layer 24 comprises a silicon oxide ($SiO_x$) layer or a silicon nitride ($SiN_x$) layer, which is formed on the first metal layer 22 through chemical vapor deposition.

Step 4: forming an oxide semiconductor layer 26 on the gate insulation layer 22 and forming a second metal layer 28 on the oxide semiconductor layer 26, wherein the second metal layer 28 comprises a titanium layer 282 formed on the oxide semiconductor layer 26 and a copper layer 284 formed on the titanium layer 282 and is subjected to a masking operation to form a data line and source/drain terminal.

The oxide semiconductor layer 26 comprises at least one of zinc oxide ($ZnO_x$), tin oxide ($SnO_x$), indium oxide ($InO_x$), and gallium oxide ($GaO_x$).

In the instant embodiment, the masking operation of Step 4 comprises:

Step 4.11: forming a photoresist layer 29 on the copper layer 284 and applying exposure and wet etching to form the data line and forming a channel 292 in the photoresist layer at a corresponding location.

Step 4.12: applying dry etching to the titanium layer 282 with carbon tetrafluoride ($CF_4$) or sulfide hexafluoride ($SF_6$).

Since the titanium layer 282 has a thickness less than 12 nm, etching must be carried out with a relatively small power in order to prevent damage of the oxide semiconductor layer 26 by plasma to ensure integrity of the oxide semiconductor layer 26 and thus ensuring the quality of the thin-film transistor.

Step 4.13: ashing a bottom of the channel 292 with oxygen ($O_2$) to expose the copper layer 284.

Step 4.14: applying wet etching to the oxide semiconductor layer 26 with oxalic acid.

Step 4.15: applying wet etching to the exposed copper layer 284 with keto acid in order to expose the titanium layer 282.

Figure 11:
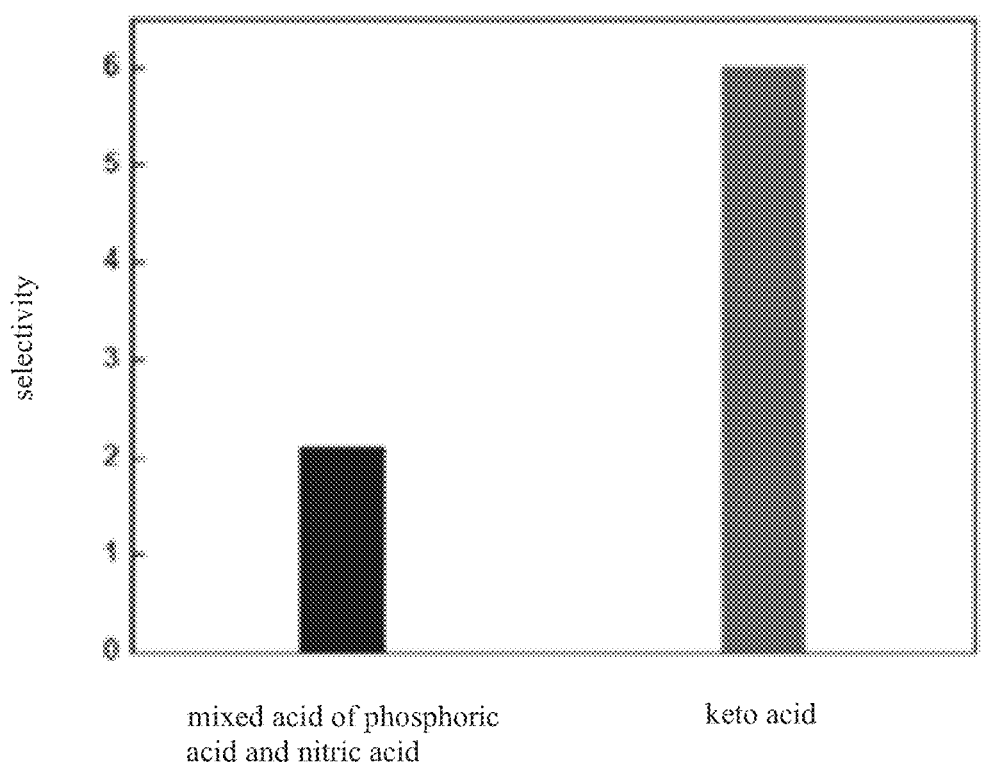
FIG. 11 is a plot illustrating comparison of selectivity of etching oxide semiconductor layer with a mixed acid of phosphoric acid and nitric acid and keto acid.

Referring to FIG. 11, a plot is given to compare selectivity of etching the oxide semiconductor layer 26 with a mixed acid of phosphoric acid and nitric acid and keto acid. It can be seen that the oxide semiconductor layer 26 is susceptible to etching by keto acid ($H_2O_2$ base) is, but is easily etched away by the mixed acid of phosphoric acid and nitric acid. Further, the bottom metal in the present invention is the titanium layer 282 and titanium does not react with keto acid. Thus, contrary to the aluminum layer and the molybdenum layer used in the prior art, the present invention uses the copper layer 284 and the titanium layer 282 as the metal layers, where the data line is formed through wet-etching of the copper layer 284 so that it is possible to avoid the defect caused by the oxide semiconductor layer 26 being also in reaction with the etchant solution when the wet etching is carried out.

Step 4.16: applying dry etching to the exposed titanium layer 282 with carbon tetrafluoride or sulfide hexafluoride and removing the photoresist layer 29 to form a source/drain terminal.

Step 5: forming a transparent conductive layer 300 on the second metal layer 28 and applying a masking operation to patternize the transparent conductive layer to form the thin-film transistor.

Figure 12:
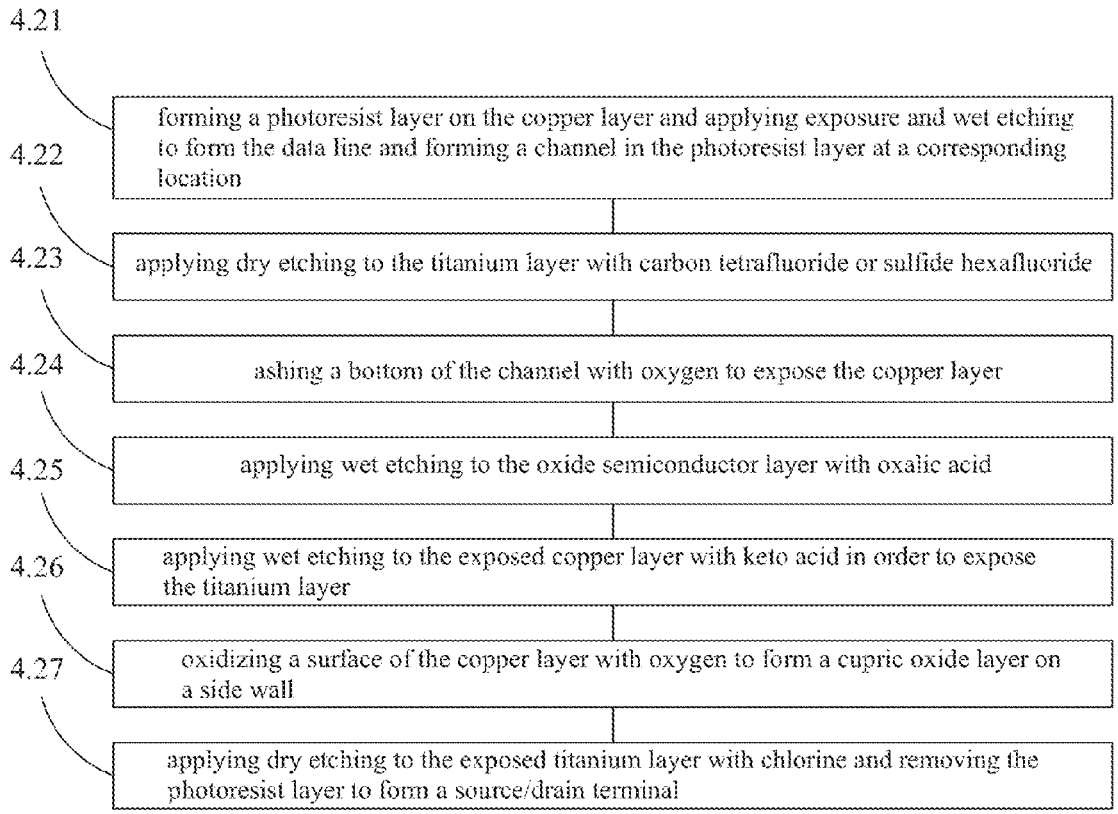
FIG. 12 is a flow chart illustrating step 4 of a method for manufacturing a thin-film transistor according to another embodiment of the present invention.

Referring to FIG. 12, with simultaneous reference to FIGS. 6-9, a flow chart of Step 4 of the method for manufacturing a thin-film transistor according to another embodiment of the present invention is illustrated. In the instant embodiment, the masking operation of Step 4 comprises:

Step 4.21: forming a photoresist layer 29 on the copper layer 284 and applying exposure and wet etching to form the data line and forming a channel 292 in the photoresist layer at a corresponding location.

Step 4.22: applying dry etching to the titanium layer 282 with carbon tetrafluoride ($CF_4$) or sulfide hexafluoride ($SF_6$).

Since the titanium layer 282 has a thickness less than 12 nm, etching must be carried out with a relatively small power in order to prevent damage of the oxide semiconductor layer 26 by plasma to ensure integrity of the oxide semiconductor layer 26 and thus ensuring the quality of the thin-film transistor.

Step 4.23: ashing a bottom of the channel 292 with oxygen ($O_2$) to expose the copper layer 284.

Step 4.24: applying wet etching to the oxide semiconductor layer 26 with oxalic acid.

Step 4.25: applying wet etching to the exposed copper layer 284 with keto acid in order to expose the titanium layer 282.

Referring to FIG. 11, a plot is given to compare selectivity of etching the oxide semiconductor layer 26 with a mixed acid of phosphoric acid and nitric acid and keto acid. It can be seen that the oxide semiconductor layer 26 is susceptible to etching by keto acid ($H_2O_2$ base) is, but is easily etched away by the mixed acid of phosphoric acid and nitric acid. Further, the bottom metal in the present invention is the titanium layer 282 and titanium does not react with keto acid. Thus, contrary to the aluminum layer and the molybdenum layer used in the prior art, the present invention uses the copper layer 284 and the titanium layer 282 as the metal layers, where the data line is formed through wet-etching of the copper layer 284 so that it is possible to avoid the defect caused by the oxide semiconductor layer 26 being also in reaction with the etchant solution when the wet etching is carried out.

Step 4.26: oxidizing a surface of the copper layer 284 with oxygen to form a cupric oxide (CuO) layer on a side wall.

Figure 13:
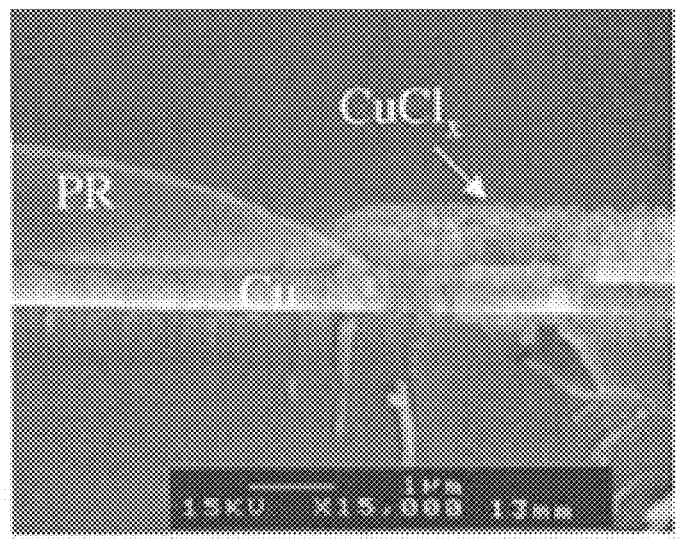
FIG. 13 is a microscopic picture for chlorine gas reacting with a copper layer for 1 minute under specific conditions (temperature 25° C., pressure 20 mTorr, electrical power 600 W, volumetric flow rate of $Cl_2$ 20 sccm)
Figure 14:
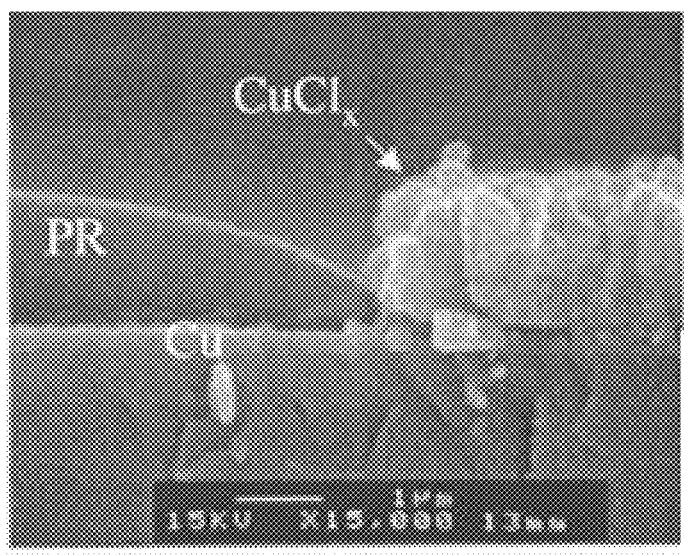
FIG. 14 is a microscopic picture for chlorine gas reacting with a copper layer for 2 minutes under specific conditions (temperature 25° C., pressure 20 mTorr, electrical power 600 W, volumetric flow rate of $Cl_2$ 20 sccm)

Referring to FIGS. 13 and 14, it can be seen that chlorine ($Cl_2$) has a stronger power in corroding copper. To prevent corrosion of the copper layer 284 by chlorine in the subsequent steps, a cupric oxide is necessarily formed by oxidizing the surface of the copper layer 284 with oxygen.

Step 4.27: applying dry etching to the exposed titanium layer 282 with chlorine and removing the photoresist layer 29 to form a source/drain terminal.

The instant embodiment achieves the same technical effect as the previous embodiment.

Figure 15:
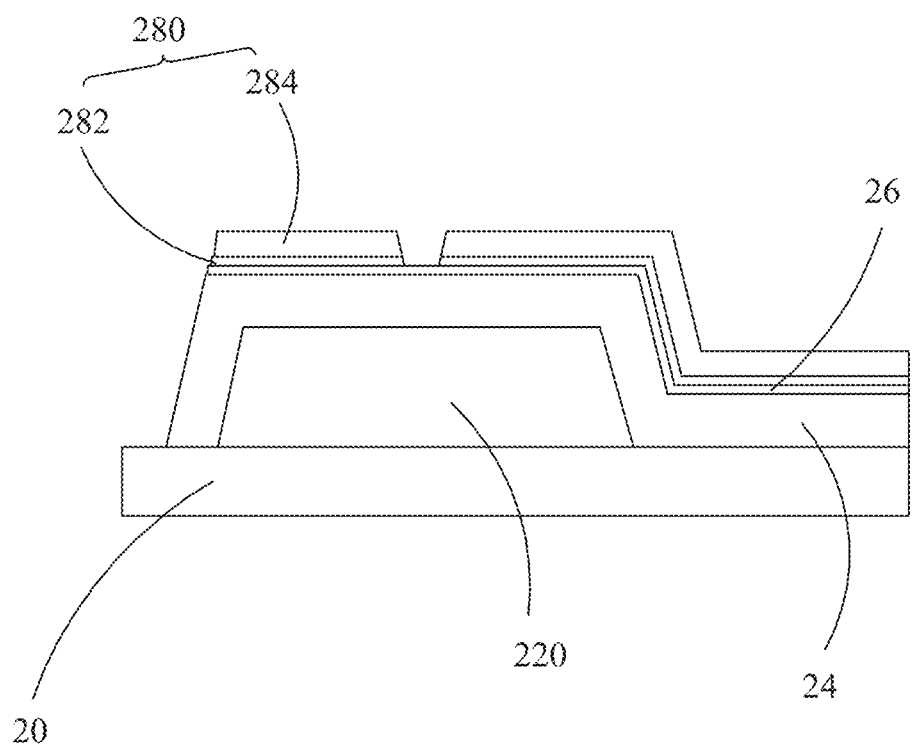
FIG. 15 is a schematic view showing the structure of a thin-film transistor according to the present invention.

Referring to FIG. 15, the present invention also provides a thin-film transistor, which comprises a substrate 20, a gate terminal 220 formed on the substrate, a gate insulation layer 24 covering the gate terminal 22, an oxide semiconductor layer 26 formed on the gate insulation layer 24, and a source/drain terminal 280 formed on the oxide semiconductor layer 26. The source/drain terminal 280 comprises a titanium layer 282 and a copper layer 284 formed on the titanium layer 282.

The substrate 20 is a transparent substrate and is preferably a glass or plastic substrate.

Since the titanium layer 282 has a thickness less than 12 nm, etching must be carried out with a relatively small power in order to prevent damage of the oxide semiconductor layer 26 by plasma to ensure integrity of the oxide semiconductor layer 26 and thus ensuring the quality of the thin-film transistor.

The oxide semiconductor layer 26 comprises at least one of zinc oxide ($ZnO_x$), tin oxide ($SnO_x$), indium oxide ($InO_x$), and gallium oxide ($GaO_x$).

In summary, the present invention provides a method for manufacturing a thin-film transistor and a thin-film transistor manufactured with same, which simultaneously form an oxide semiconductor layer and a second metal layer, wherein the second metal layer is a combined layer of a titanium layer and a copper layer and etching with keto acid is applied to the copper layer and etching with carbon tetrafluoride, sulfide hexafluoride or chlorine gas is applied to the titanium layer to thereby form a source/drain terminal. Compared to a conventional thin-film transistor of which a source/drain terminal is formed of an aluminum layer and a molybdenum layer, masking operations are reduced so as to effectively shorten manufacturing time and lower down manufacturing cost. Further, the thin-film transistor according to the present invention shows better electrical property than that of a conventional coplanar-structure thin-film transistor and thus improves the quality of thin-film transistor.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing a thin-film transistor, comprising the following steps:
   (1) providing a substrate;
   (2) forming a first metal layer on the substrate and applying a masking operation to form a gate terminal;
   (3) forming a gate insulation layer on the gate terminal;
   (4) forming an oxide semiconductor layer on the gate insulation layer and forming a second metal layer on the oxide semiconductor layer, wherein the second metal layer comprises a titanium layer formed on the oxide semiconductor layer and a copper layer formed on the titanium layer and is subjected to a masking operation to form a data line and source/drain terminal; and
   (5) forming a transparent conductive layer on the second metal layer and applying a masking operation to patternize the transparent conductive layer to form the thin-film transistor;
   wherein the masking operation of step (4) comprises:
   (4.11) forming a photoresist layer on the copper layer and applying exposure and wet etching to form the data line and forming a channel in the photoresist layer at a corresponding location;
   (4.12) applying dry etching to the titanium layer with carbon tetrafluoride or sulfide hexafluoride;
   (4.13) ashing a bottom of the channel with oxygen to expose the copper layer;
   (4.14) applying wet etching to the oxide semiconductor layer with oxalic acid;
   (4.15) applying wet etching to the exposed copper layer with keto acid in order to expose the titanium layer; and
   (4.16) applying dry etching to the exposed titanium layer with carbon tetrafluoride or sulfide hexafluoride and removing the photoresist layer to form a source/drain terminal.

2. The method for manufacturing a thin-film transistor as claimed in claim 1, wherein the substrate comprises a glass or plastic substrate.

3. The method for manufacturing a thin-film transistor as claimed in claim 1, wherein the titanium layer has a thickness less than 12 nm.

4. The method for manufacturing a thin-film transistor as claimed in claim 1, wherein the oxide semiconductor layer comprises at least one of zinc oxide, tin oxide, indium oxide, and gallium oxide.

5. A method for manufacturing a thin-film transistor, comprising the following steps:
   (1) providing a substrate;
   (2) forming a first metal layer on the substrate and applying a masking operation to form a gate terminal;
   (3) forming a gate insulation layer on the gate terminal;
   (4) forming an oxide semiconductor layer on the gate insulation layer and forming a second metal layer on the oxide semiconductor layer, wherein the second metal layer comprises a titanium layer formed on the oxide semiconductor layer and a copper layer formed on the titanium layer and is subjected to a masking operation to form a data line and source/drain terminal; and
   (5) forming a transparent conductive layer on the second metal layer and applying a masking operation to patternize the transparent conductive layer to form the thin-film transistor;
   wherein the masking operation of step (4) comprises:
   (4.21) forming a photoresist layer on the copper layer and applying exposure and wet etching to form the data line and forming a channel in the photoresist layer at a corresponding location;
   (4.22) applying dry etching to the titanium layer with carbon tetrafluoride or sulfide hexafluoride;
   (4.23) ashing a bottom of the channel with oxygen to expose the copper layer;
   (4.24) applying wet etching to the oxide semiconductor layer with oxalic acid;
   (4.25) applying wet etching to the exposed copper layer with keto acid in order to expose the titanium layer;
   (4.26) oxidizing a surface of the copper layer with oxygen to form a cupric oxide layer on a side wall; and
   (4.27) applying dry etching to the exposed titanium layer with chlorine and removing the photoresist layer to form a source/drain terminal.

6. The method for manufacturing a thin-film transistor as claimed in claim 5, wherein the substrate comprises a glass or plastic substrate.

7. The method for manufacturing a thin-film transistor as claimed in claim 5, wherein the titanium layer has a thickness less than 12 nm.

8. The method for manufacturing a thin-film transistor as claimed in claim 5, wherein the oxide semiconductor layer comprises at least one of zinc oxide, tin oxide, indium oxide, and gallium oxide.

9. A method for manufacturing a thin-film transistor, comprising the following steps:
   (1) providing a substrate;
   (2) forming a first metal layer on the substrate and applying a masking operation to form a gate terminal;
   (3) forming a gate insulation layer on the gate terminal;
   (4) forming an oxide semiconductor layer on the gate insulation layer and forming a second metal layer on the oxide semiconductor layer, wherein the second metal layer comprises a titanium layer formed on the oxide semiconductor layer and a copper layer formed on the titanium layer and is subjected to a masking operation to form a data line and source/drain terminal; and
   (5) forming a transparent conductive layer on the second metal layer and applying a masking operation to patternize the transparent conductive layer to form the thin-film transistor;
   wherein the substrate comprises a glass or plastic substrate;

wherein the titanium layer has a thickness less than 12 nm;
wherein the oxide semiconductor layer comprises at least one of zinc oxide, tin oxide, indium oxide, and gallium oxide; and
wherein the masking operation of step (4) comprises:
(4.11) forming a photoresist layer on the copper layer and applying exposure and wet etching to form the data line and forming a channel in the photoresist layer at a corresponding location;
(4.12) applying dry etching to the titanium layer with carbon tetrafluoride or sulfide hexafluoride;
(4.13) ashing a bottom of the channel with oxygen to expose the copper layer;
(4.14) applying wet etching to the oxide semiconductor layer with oxalic acid;
(4.15) applying wet etching to the exposed copper layer with keto acid in order to expose the titanium layer; and
(4.16) applying dry etching to the exposed titanium layer with carbon tetrafluoride or sulfide hexafluoride and removing the photoresist layer to form a source/drain terminal.

* * * * *